(12) United States Patent
Atchinson et al.

(10) Patent No.: US 6,371,637 B1
(45) Date of Patent: Apr. 16, 2002

(54) COMPACT, FLEXIBLE, LED ARRAY

(75) Inventors: Geoffrey P. Atchinson; Mitchell A. Valentine, both of Irvine, CA (US)

(73) Assignee: Radiantz, Inc., Orange, CA (US)

( * ) Notice: Subject to any disclaimer, the term of this patent is extended or adjusted under 35 U.S.C. 154(b) by 0 days.

(21) Appl. No.: 09/477,637

(22) Filed: Jan. 3, 2000

Related U.S. Application Data

(63) Continuation-in-part of application No. 09/258,057, filed on Feb. 26, 1999.

(51) Int. Cl.[7] .................................................. F21V 7/04
(52) U.S. Cl. ...................... 362/555; 362/249; 362/252; 362/800
(58) Field of Search ................................ 362/240, 252, 362/249, 295, 800, 293

(56) References Cited

U.S. PATENT DOCUMENTS

| | | | |
|---|---|---|---|
| 4,298,869 A | * 11/1981 | Okuno ........................ 340/782 |
| 4,591,954 A | 5/1986 | Kawamura et al. ............ 362/61 |
| 4,774,434 A | * 9/1988 | Bennion ...................... 313/500 |
| 5,062,027 A | 10/1991 | Machida et al. ............ 362/80.1 |
| 5,211,466 A | 5/1993 | Jarocki et al. ............. 362/83.3 |
| 5,272,602 A | 12/1993 | Sasajima et al. ........... 362/80.1 |
| 5,700,080 A | 12/1997 | Okuda ......................... 362/80 |
| 5,865,529 A | * 2/1999 | Yan ............................. 362/327 |
| 6,158,882 A | * 12/2000 | Bischoff, Jr. ................ 362/488 |

* cited by examiner

Primary Examiner—Sandra O'Shea
Assistant Examiner—John Anthony Ward
(74) Attorney, Agent, or Firm—John W. Eldredge; Stradling, Yocca, Carlson & Rauth

(57) ABSTRACT

A flexible, high density, low profile lighting system includes a flexible printed circuit board substrate which is adapted to support and electrically interconnect surface mount electronic components. Plurality of surface mount light emitting diodes is mounted on the substrate so as to define a conformably bendable lighting array configured for mounting upon surfaces with compound curvature. Each of the surface mount light emitting diodes has a footprint of 5 mm$^2$, or less, and, when mounted adjacent and in contact with one another defines a light intensity output of from about 2 to about 20 candles per cm$^2$.

23 Claims, 4 Drawing Sheets

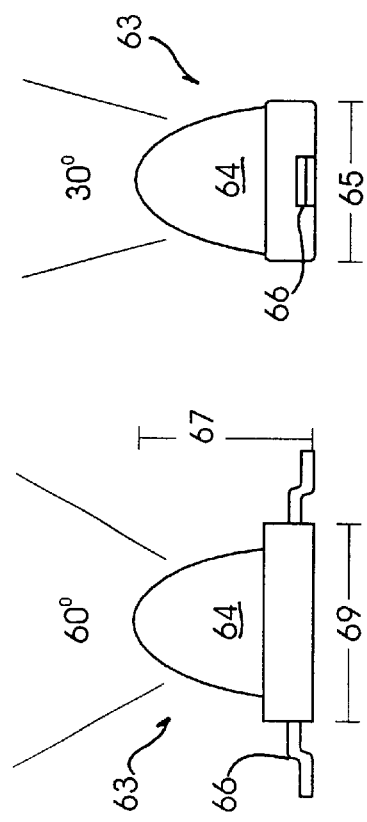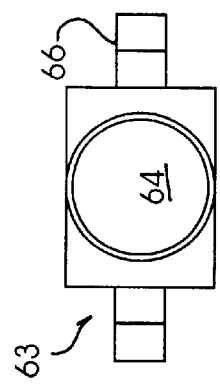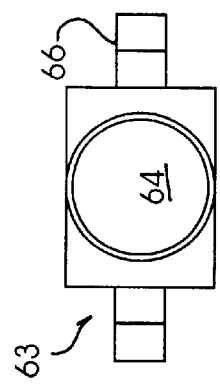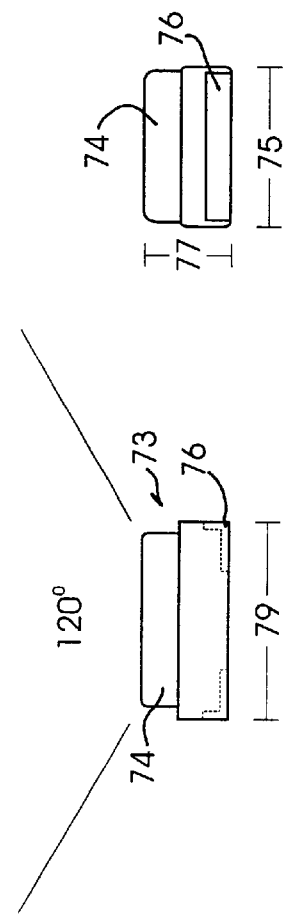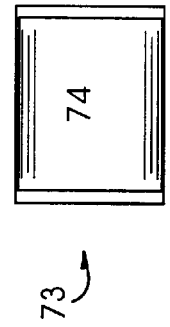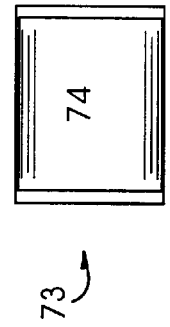

COMPACT, FLEXIBLE, LED ARRAY

CROSS-REFERENCE TO RELATED APPLICATION(S)

The present application is a continuation-in-part of co-pending U.S. patent application Ser. No. 09/258,057, filed Feb. 26, 1999, the entire disclosure of which is expressly incorporated herein by reference.

FIELD OF THE INVENTION

The present invention relates generally to lighting systems and, more particularly, to flexible, compact, battery operated LED arrays that are able to be conformably mounted over surfaces with compound curvatures.

BACKGROUND OF THE INVENTION

Light emitting diode (LED) lighting systems are commonly used as individual elements or in groups for illuminating a large variety of objects. Typically, such lighting systems are arranged in generally linear rows and are disposed so as to provide decorative, advertising or safety oriented light sources. Conventionally, these lighting system rows might be attached to a wire string such as exemplified by a "string of lights" used for Christmas tree decorations. Lighting systems constructed of LED light strips, are particularly advantageous when compared to bulb or lamp based lighting systems in that light strips are relatively inexpensive to manufacture and consume a relatively small amount of power. However, conventional lighting systems, whether bulb based or LED based are limited in usefulness due to the difficulty of attaching them to various structures and that these types of lighting systems are often inflexible in their design and require permanent mounting to attached structures.

Present LED light strips typically composed of circuitry including a number of LEDs mounted onto substrates by having their whisker leads soldered onto connection points provided for such purpose and connected to electrical conductors. The entire circuitry is typically encased within a protective sheathing and coupled to a power source for selective LED illumination. Such LED lighting systems are utilized in a variety of indoor and outdoor configurations, but suffer from significant drawbacks in that the LED lamps are rather large, are exposed to the elements and are very susceptible to damage by wind, water, etc. Additionally, these LED lighting systems require that the LED lamps be adhered to a mounting substrate by having their whisker leads soldered thereto. Once the LED lamp is affixed to the substrate, excess lead material must be removed and the resulting assembly mounted on a support that is substantially flat in order that the viewing angle for the component LED lamps is not exceeded.

Conventional LED based lighting systems typically utilize dual-lead cannister or dome shaped LED lamps as a light source. These dome or cannister shaped LED lamps are typically about 5 to 7 millimeters tall and from about 3 to about 5 millimeters in diameter, exclusive of their electrically conductive leads. Although available in various colors, a typical conventional LED lamp will have a light intensity (expressed in millicandles or mcd) of from about 8 to about 50, when implemented in Galium Phosphide (GaP) with a viewing angle of approximately 10 to 15 degrees. Needless to say, when such lighting systems are mounted over radiused or other conformal surfaces, it requires very little displacement to move the beam angle of a particular LED lamp outside the viewing arc.

For example, LED lighting systems have been used in the prior art as auxiliary brake lights in automotive applications. Five millimeter LEDs are typically used to supplement original equipment vehicle brake lights and incorporated onto a mounting surface which is adhered or secured to the rear portion of a vehicle. Considerable differences in angles of inclination and curvatures of rear window glasses and other vehicular surfaces limit the usefulness of such LED lighting systems. For example, when an auxiliary brake light is mounted on a vehicle provided with a rear window glass having a strong curvature, an optimum mounting or viewing angle for each LED lamp may not be achieved. For this reason, a single type of auxiliary light, capable of being placed on various portions of all manners of vehicles, is very difficult to economically manufacture.

In addition, many conventional 5 millimeter LED lighting systems have their LED lamps spaced-apart from one another to such an extent that the individual component light sources are easily discernable. In other words, instead of a viewer perceiving a lighting system having uniform brightness, the viewer perceives intermittent bright spots, corresponding to LED light source positions, over the surface area of the lighting system. Various prior art systems have attempted to address this problem by placing distortion lenses (or diffusion lenses) over the LED light sources, but these distortion lenses are not altogether effective and further tend to reduce the overall brightness of the lighting system. Conventional 5 millimeter LEDs, even if disposed as close together as possible, still exhibit inconsistent light distribution due to their relatively shallow viewing angles. Prior art lighting systems are thus relatively large, visually unpleasing and relatively expensive and time consuming to manufacture. Thus, in addition to exhibiting relatively poor performance, their size and shape tend to make them objectionably obtrusive.

Accordingly, what is needed is a flexible, low-profile, bright, easily manufactured and visually pleasing light emitting diode system which can be mounted easily, in any desired form over radically radiused compound curvatures, for a variety of uses. Further, such a light emitting diode system needs to provide a constant source of light while operated by a relatively low voltage battery source.

SUMMARY OF THE INVENTION

A flexible, low profile, high density array of light emitting diodes includes a plurality of surface mount light emitting diodes affixed to the surface of a flexible printed circuit board substrate, the substrate adapted to support and electrically interconnect surface mount electronic components. Each of the plurality of surface mount light emitting diodes has a particular dimension, less than or equal to about 3 mm, and is disposed on the flexible printed circuit board substrate at varying distances in order to define light intensity outputs of from about 2 to about 20 candles per square centimeter.

The flexible printed circuit board substrate might be configured as a flex circuit, or might be configured as a rigid flex circuit board, each pre-manufactured to define mounting locations for each of the plurality of surface mount light emitting diodes. The flexible printed circuit board substrate, in combination with the surface mount light emitting diodes, defines a conformable, bendable lighting array configured for mounting upon surfaces with compound curvature.

The surface mount light emitting diodes are configured, upon the flexible substrate, in an array comprising regular sets of series-connected diodes, the series-connected sets coupled in parallel fashion to one another. The number of light emitting diodes comprising a series-connected set defines a forward voltage drop for the set. The forward voltage drop, in turn, defines a supply voltage value sufficient to activate the diodes of each series-connected set. Surface mount diodes comprising the array might have forward voltage drops anywhere in the range of from about 1.7 to about 5.0 volts.

In a further aspect of the invention, the flexible, low profile, high density lighting system further includes a housing configured to hold and support a flexible lighting array and so encloses the array as to protect it from impact and the elements. The housing might be transparent and might further be colored. Alternatively, the housing might be water clear and the plurality of surface mount light emitting diodes might be colored.

DESCRIPTION OF THE DRAWINGS

These and other features, aspects and advantages of the present invention will be more fully understood when considered with respect to the following detailed description, appended claims and accompanying drawings, wherein:

FIG. 6a is a side elevation view of one embodiment of a surface mount light emitting diode suitable for use in connection with the diode array of the present invention;

FIG. 6b is an end view of the surface mount light emitting diode of FIG. 6a;

FIG. 6c is a top planar view of the surface mount light emitting diode of FIG. 6a;

FIG. 7a is a side elevation view of an alternative embodiment of a surface mount light emitting diode suitable for use in connection with the diode array of the present invention;

FIG. 7b is an end view of the surface mount light emitting diode of FIG. 7a;

FIG. 7c is a top planar view of the surface mount light emitting diode of FIG. 7a;

DETAILED DESCRIPTION OF THE INVENTION

Figure 1:
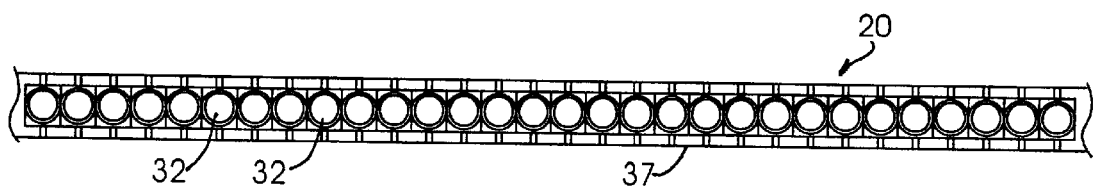
FIG. 1 is a top planar view of a high-density, low-profile, flexible light emitting diode array in accordance with the present invention.

Briefly, the present invention is directed to a high-density, low-profile, flexible light emitting diode array which is constructed to have an extremely narrow width and an extremely low profile and have its elements so disposed that the length of the array is able to vary in accordance with any desired application. In typical embodiments, an array length might vary from about a few inches to several feet, and the array itself can be adaptively configured to a desired length by merely cutting the desired length from a roll, as will be described in greater detail below.

The high-density, low-profile, flexible light emitting diode array is very compact and elegant which enables it to be used for a number of sophisticated interior applications, such as volume or accent highlighting, architectural and landscaping delineation, and the like. Additionally, the high-density, low-profile, flexible light emitting diode array is able to deliver a very high light output (light intensity) per unit volume, which enables the light emitting diode array to be used for various industrial, safety and other exterior utility applications, such as vehicle lighting systems, marker lights, building safety lamps, and the like. Flexibility is a further advantageous feature of the light emitting diode array which is configured such that it is able to be flexed or bent into extremely compound or complex shapes including those with a very small radius of curvature. When a flexible strip of the light emitting array is affixed to an interior rear window or ceiling of an automobile, for example, as an auxiliary brake light, the extremely thin and narrow profile of the array does not substantially block a driver's vision nor does it substantially intrude into the limited interior space of the passenger compartment of the vehicle.

With a very high light intensity per unit volume, the light emitting diode array is particularly advantageous when used in building safety systems that provide emergency lighting when central power is cut off. The light emitting diode array is configured to be battery operated such that it is not susceptible to AC power outages and provides sufficient light output to clearly mark emergency exits, stairs, emergency signage, and the like. Because of the adaptability of its size and shape, the light emitting diode array can be easily conformed to any size space to provide such battery powered illumination; with small strips providing sufficient illumination for relatively small areas, and larger strips, or alternatively planar sheets, disposed within large areas.

In addition to its high light output, another desirable aspect of the light emitting diode array is its unique and captivating appearance, which when activated resembles a bright, focused laser beam spanning the lighting system's length, from end-to-end. This laser beam look provides an eye catching safety feature which compliments the efficacy of the light emitting diode array when used for safety applications, and further provides a well-defined and modern look to the light-emitting diode array when used in other applications such as decorative and space-lighting installations. It can easily be understood that the array might be formed into strips that define alphanumeric text, which can be easily read from a distance. Thus, the array might easily be formed into safety side-panel strips (and emitting amber light) for example, for placement onto the exterior side panels of vehicles and for emergency or informative road signage.

Figure 2:
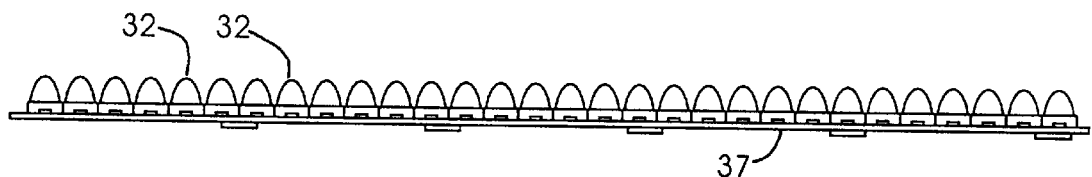
FIG. 2 is a side elevation view of the high-density, low-profile, flexible light emitting diode array in accordance with the present invention.

Referring more particularly to the drawings, FIGS. 1 and 2 illustrate a high-density, low-profile light emitting diode array constructed with an extremely compact configuration and having a very high density of light emitting elements disposed thereon. The array 20 is depicted in the exemplary embodiment of FIGS. 1 and 2 in a particular configuration only for purposes of description and ease of understanding, and not for the purpose of limiting the invention to any extent.

In particular, the array 20 of the exemplary embodiment of FIGS. 1 and 2, is suitably constructed from a plurality of light emitting diode elements 32 disposed in close proximity to one another and mounted on a flexible substrate 37, in accordance with the present invention. In the exemplary embodiment of FIGS. 1 and 2, the light emitting diode elements are disposed on the flexible substrate 37 at positions approximately 2 mm on centers, such that the center of each LED element is approximately 2 mm from the center of an adjacent LED element or elements. In this particular exemplary embodiment, the LED elements 32 are in physical contact with one another and, as will be described in greater detail below, such proximity causes each element's resulting beam to overlap with the beam from adjacent elements in order to define a uniform light field.

Each of the light emitting diode elements 32 are surface mounted to a flexible substrate, in particular, a class A or class B flex circuit board, as defined by MIL-STD-2118. Class A flex circuits are defined as those capable of withstanding flexing during installation, while class B flex circuits are defined as those capable of withstanding continuous flexing for a specified number of cycles after the flex circuit has been installed.

Because flex circuits will typically be bent during assembly and may be flexed continually during use, certain circuit features must be designed with sufficient strain relief. These particular circuit features are well understood and need not be dealt with here, but it should be noted that depending on its application, the light emitting diode array when configured on a class B flex circuit should be constructed to be as thin as is practical and should further be symmetrical, such that its conductor layers are maintained as close as possible to the neutral axis.

The flex circuit material depends significantly upon the type and complexity of the light emitting diode array disposed thereon, but for most applications, a simple single layer or double layer plated through hole (PTH) flex circuit will be suitable. Polyimide is the most popular material for high reliability applications, but polyester film for the insulation layer is equally suitable. Adhesives might include polyester, acrylic or epoxy adhesives, with a polyester film and polyester adhesive combination offering the greatest degree of flexibility at the lowest cost.

Rolled annealed copper is the most common conductor used for flexible printed circuits due to its superior flexing characteristics and high conductivity. Electro deposited copper is used in applications when its temper can be an asset, such as in applications requiring extremely fine cantilevered leads. Notwithstanding the foregoing, flex circuits may be manufactured from other metals, such as beryllium copper, nickel and stainless steel, depending on the mounting or utility application of the light emitting diode array system 20.

The primary function of flexible circuits is the interconnection of one electronic component to another and the method used to terminate the flexible interconnection is of particular concern. As will be described in greater detail below, the preferred LED element is a low-profile surface mount LED which is able to be mounted on a flexible circuit by a variety of methods. In particular, flex circuits might terminate in through hole solder pads capable of accepting a connector or being soldered directly onto a component. Copper or copper alloy fingers can be soldered in place and secured within the circuit's insolation layer and can further be etched to any configuration and be custom formed so as to accept any type of low-profile surface mount LED lead configuration. Exposed pads can be formed to provide a dimple pattern for use in pressure contact applications or shaped insulation openings can be provided for surface mount directly to the flex circuit. In the latter attachment method, polyimide stiffeners can be bonded to the flex circuit in order rigidize the surface mount areas.

Although the substrate has been described as a flex circuit, it should be understood that it need not necessarily conform to the requirements of MIL-STD-2118 nor the technical requirements necessary to be referred to as a "flex circuit". Indeed, the flexible substrate 37 might be of a type commonly termed a "rigid flex" circuit board which exhibits a substantially higher flex modulus response than a classical "flex circuit", without losing a substantial amount of its flexible characteristics. Indeed, a rigid flex circuit might be best characterized by its springiness, in that once bent to conform to a compound shape, its modulus response will tend to force it back to a planar condition, as opposed to a "flex circuit" which, once bent, has a substantially lower spring constant k.

FIGS. 6a, 6b and 6c are side elevational, end elevational, and top planar views, respectively of one exemplary embodiment of a low-profile, surface mount light emitting diode 63 in accordance with the exemplary embodiment of the present invention. Surface mount light emitting diodes, of the type exemplified in FIGS. 6a–6c, are generally implemented in cross-sectional widths ranging from about 2 mm to about 3 mm and have been conventionally used in relatively low power applications, and those with relatively low light intensity requirements. The exemplary surface mount light emitting diode 63 of the illustrated embodiment exhibits a relatively high output of approximately 1 candle of light and is suitably constructed to have a width (identified at 65) of about 2 mm, a height (identified at 67) of about 2.8 mm and a length (identified at 69) of about 2.5 mm. The low-profile surface mount light emitting diode 63 is preferably mounted on a flexible substrate 37 with its length dimension perpendicular to the length of the flexible substrate such that a maximum linear density of elements may be disposed thereon.

The light emitting diode 63 may be provided in a variety of colors, including white, red, yellow, green, and blue. The emitting color and light output is dependent on the diode semiconductor material which might include GaP, GaAsP/GaP, GaAIAs or InGaAIP, for output wavelengths ranging from about 565 nanometers to about 660 nanometers. A lens 64 (dome shaped in the exemplary embodiment of FIGS. 6a–6c) is provided over the light emitting semiconductor material and might be a colored transparent lens, a colored diffusing lens, or a water clear lens, depending upon the final color and light output desired for each light emitting element. In particular, depending on lens type, the light emitting diode 63 of the exemplary embodiment has a light intensity Iv (expressed in millicandles or mcd at 20 mA), ranging from about 200 to about 1000, evaluated at a nominal viewing angle of from approximately 30 degrees to approximately 60 degrees.

Figure 8:
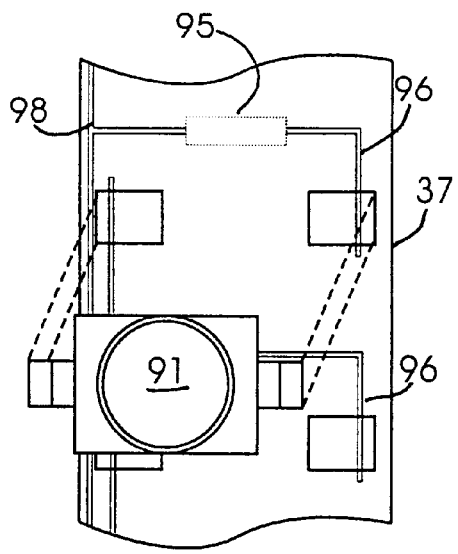
FIG. 8 is a simplified, semi-schematic illustration of a surface mount light emitting diode being surface mounted on an exemplary flexible substrate.

Surface mount bonding leads 66 are provided and project from both sides of the diode bulk in the length direction. One of the leads is electrically coupled to the anode side of the diode semiconductor material, while the other lead is electrically coupled to the cathode side. During assembly, each diode element is positioned onto a pre-manufactured, flexible substrate, configured to receive surface mount diodes, such that the mount leads contact exposed conductors, surface mount solder bumps, or bonding pads, as best illustrated in FIG. 8. Mounting areas are located in pre-defined regions on the flexible substrate material so that their positioning and periodicity can be easily programmed into automated pick-and-place equipment. The size, shape and bond lead locations of the diode elements are equally pre-defined and programmable such that the entire operation can be fully automated.

The diode element 63 of FIGS. 6a–6c is merely one embodiment of diode elements suitable for practice of the present invention. Since its beam is relatively directional, due to its 30 to 60 degree viewing angle, its perceived light intensity output makes it particularly suitable for applications which require the attention of a viewer to be drawn to the lighting system, i.e., vehicular lights, emergency signs, etc. Other types of surface mount diode elements are also suitable for practice of the invention in various alternative embodiments.

A particular such alternative diode element is illustrated in FIGS. 7a, 7b and 7c. FIGS. 7a–7c depict an extremely low-profile light emitting diode element 73, which is substantially smaller in cross-section than the embodiment of FIGS. 6a–6c. Diode element 73 has a width 75 of about 0.8 mm, a height 77 of about 0.5 mm, and a length 79 of about 1.6 mm. Further, it should be understood that the height dimension will vary whether or not the diode element 73 is provided with a cover (or lens, indicated at 74). In the particular configuration illustrated in FIGS. 7a–7c, each light emitting diode would have a light intensity of from about 100 to about 300 millicandles (mcd), again at 25 mA, but evaluated at the optical axis of a viewing angle of about 120 degrees to about 150 degrees. Thus, while its specified light intensity is lower than the previous embodiment, its output is distributed across a wider dispersion angle, making this embodiment particularly suitable for wide area illumination applications.

The diode 73 also includes bonding leads 76, coupled to the semiconductor material's anode and cathode terminals, and which are conformally formed about the bottom edge of the bulk material so as to further reduce the diode's area footprint.

The light intensity ratio, in candles per unit length, may be varied by adjusting the spacing of the light emitting diodes along the length of the flexible substrate. The light ratio may be lower, on a per centimeter basis, if smaller diodes are substantially spaced-apart from one another, and may be much greater, on a per centimeter basis, if the slightly larger sized, lower dispersion angle, diodes are mounted closer together, or even in contact proximity with one another.

In accordance with the present invention, both the lengths and widths of the light emitting diode may vary widely, depending on the application, but are generally selected to be within a range of from about 2 mm to about 3 mm. A particularly suitable set of surface mount light emitting diodes are the KP, KA, and KM, series of diodes manufactured and sold by Kingbright Corporation, City of Industry, Calif. These surface mount LEDs exhibit viewing angles of anywhere from about 15 to about 150 degrees, which allows a lighting system, constructed in accordance with the invention, to be tailored to specific desirable dispersion and viewing characteristics, when compared to various prior art devices.

Returning momentarily to FIGS. 1 and 2, the width dimension 72 of the particular high-density, low-profile light emitting diode array 20 illustrated in the exemplary embodiment, is approximately 0.25 cm. Given an approximately 1.0 cm long section of the lighting system, the total surface area can be seen to be approximately 0.25 cm$^2$, which would host five surface mount LEDs as embodied in FIGS. 6a–6c. With each of the surface mount LED elements emitting approximately 1 candle of light, the light intensity output of the light emitting diode array 20 of the exemplary embodiment can be seen to be about 20 candles/cm$^2$. The present inventors believe this to be an extremely high, and indeed a previously unobserved, LED light intensity per unit area ratio.

Figure 9:
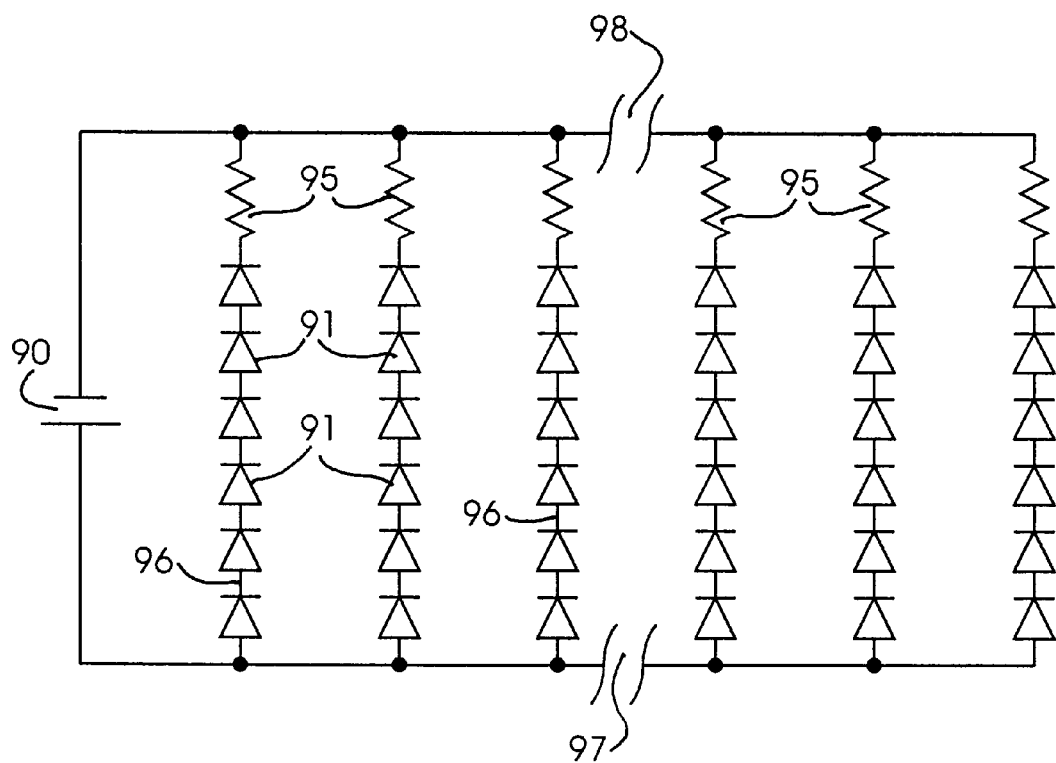
FIG. 9 is a simplified, semi-schematic circuit diagram illustrating the electrical connectivity of the surface mount LEDs, resistive elements and power source, in accordance with the present invention.

Turning now to FIG. 9, there is depicted in simplified, semi-schematic form, an exemplary circuit diagram showing the electrical connectivity of the surface mount LED elements, resistive elements and power source, as they might be implemented on a typical flexible substrate (as shown in FIG. 8), in accordance with the present invention. As contemplated by the invention, a flexible printed circuit board (37 of FIG. 8) is double-sided, with the surface mount light emitting elements 91 connected to a front side (or facing side) with resistive elements 95 and electrical traces 96 disposed on the opposite side (backside) of the flexible printed circuit board. This particular arrangement allows for an extremely compact distribution of surface mount lighting elements along the facing surface of a flexible printed circuit board.

In alternative embodiments, the surface mount light emitting elements and their associated resistors can be disposed on alternate sides of a flexible substrate or may be all disposed on the same side in various proportions. For example, in one particular alternative embodiment, where the surface mount light emitting elements are spaced-apart on 5 mm centers, sufficient space remains between various LED elements to dispose the associated resistors on the same side of the flexible printed circuit board substrate.

Power is supplied externally to the array by an external voltage supply 90 which might be implemented as a battery, an AC to DC converter, or some other direct current power source which provides a power supply voltage which, in turn, might range from about 3 to about 30 volts. The individual elements 91 of the array are arranged, in the exemplary embodiment of FIG. 9, as a 6 element series-connected string coupled, in turn, to a resistor 95 in series fashion. Each elemental string and resistor combination is coupled, in parallel fashion, with other, similar diode/resistor strings if additional length, or additional light intensity output is desired. LED elements 91 comprising the array exhibit various values of forward voltage drop $V_F$, the magnitudes of which depend on the semiconductor material chosen for the diode, the current through the diode, etc. Typical diodes, of the type exemplified in FIGS. 6a–6c, have forward voltages of anywhere from about 1.5 to about 2.5 volts, while diodes of the type exemplified in FIGS. 7a–7c may have forward drops as high as 4.0 Volts, or more. In order to activate series coupled strings of diodes, the power supply voltage must be, at least, as large as the sum of the series stack's forward drop. Thus, it is evident that the number of diodes 91 that are connected in series fashion to one another is necessarily dependent upon the magnitude of the power supply voltage.

For the K series surface mount LEDs of the exemplary embodiment of FIGS. 6a–6c, a typical operating forward current for each of the diodes might range from about 10 to about 50 milliamps, with the maximum current being limited by the current carrying capability of the conductive leads of the flexible substrate. In the exemplary embodiment of FIG. 9, with 6 diode elements 91 comprising a series-connected string in combination with a resistor 95, it should be evident that a 12 volt power supply will be required in order to provide a sufficient voltage drop across the string in order to activate all the diode elements. It will, of course, be evident that disposing larger numbers of diodes within a string will require a higher value power supply, while a lower value power supply, such as a 5 volt supply, could accommodate series strings consisting of two type K diodes in combination with a resistor. Diodes with higher valued forward drops will need a larger supply voltage, for a given stack or string size.

It will be further evident from the exemplary embodiment of FIG. 9, that coupling a plurality of series-connected diode strings in parallel fashion with one another, allows the diode array to be fabricated in long rolls, and to be cut to length by merely separating parallel sections from one another by cutting the supply lead between parallel-disposed series stacks (indicated at 97) and by cutting the return lead between resistors (indicated at 98). Thus, it should be understood that using a "flex circuit" substrate is particularly advantageous when the light emitting diode array is manufactured in a roll and intended to be cut to length upon application.

Figure 3:
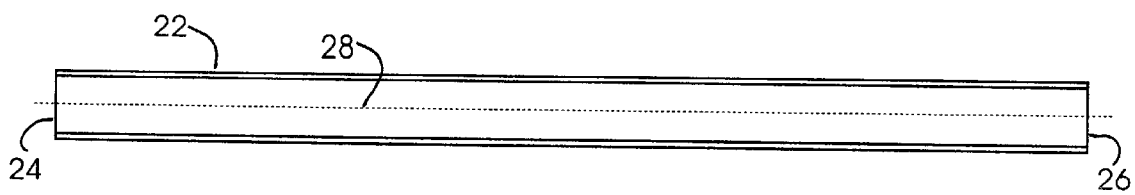
FIG. 3 is a top planar view of one embodiment of a housing for use with the light emitting diode array in accordance with the invention.
Figure 5:
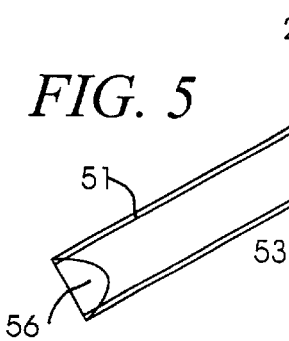
FIG. 5 is a perspective view of the exemplary embodiment of the housing of FIG. 3.
Figure 4:
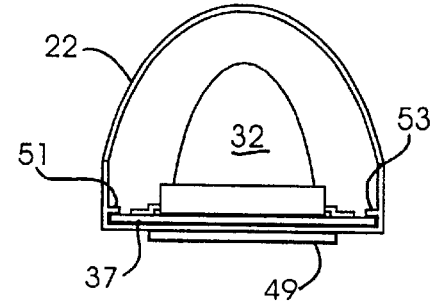
FIG. 4 is an end view of the exemplary housing embodiment of FIG. 3, illustrating a lighting element within.

Returning again to the exemplary embodiment of FIGS. 1 and 2, and with reference to FIGS. 3, 4 and 5, the light emitting diode array 20 might be suitably disposed within some form of housing 22 that is able to protect the lighting system from the elements. The housing 22 includes a first end 24 and a second, opposite end 26 and defines a longitudinal axis 28 extending between the ends. A flexible substrate 37 supporting a plurality of light emitting diode elements 32 is disposed within the housing 22 with the elements arranged along the axis 28 and preferably in proximity to one another. In the exemplary embodiment of FIGS. 1 and 2, the elements 32 are assembled approximately 2 mm off center such that each element contacts an adjacent element or elements.

In order to provide greater flexibility, the elements 32 may be spaced-apart from another such that the composite structure might be mounted on a concave surface without adjacent elements contacting one another and unduly compressing the structure. In an alternative embodiment, the light emitting elements 32 might be spaced at about 3 mm on centers, such that the center of each element is approximately 3 mm from the center of an adjacent element with approximately 1 mm of space there between. This particular configuration provides greater flexibility to the array when the assembly is flexed in the direction of arrows A1 and A3.

In a further alternative embodiment, the light emitting elements 32 might be spaced at about 7 mm on centers, such that each element is disposed approximately 5 mm from an adjacent element. This particular spacing serves as an effective limit to the uniformity of the light field provided by the array, when the elements are selected so as to have an approximate 60 degree viewing angle. Although it is quite within the contemplation of the present invention to space the elements farther apart, doing so would necessarily create periodic bright spots along the length of the array as the light field brightened and darkened with the periodicity of the elements. Several applications, however, can be contemplated which would allow for such extended periodicity, including safety lighting along the steps of a movie theater, for example. In these cases, lighting elements can be spaced as far apart as twelve inches or more if required.

In FIGS. 3–5, the housing 22 is illustrated as being completely transparent, but might suitably be provided with its transparency only in areas where it is desirable for light to be emitted. The entire housing 22 or portions thereof, might be configured to be clear without color, to provide a certain look, with the plurality of light emitting elements 32 being constructed to emit a certain color of light when activated. Alternatively, light emitting elements might be selected to emit a white light, with the housing being colored, in turn.

FIGS. 3, 4 and 5 illustrate a top planar, end and perspective view, respectively, of a typical housing 22 such as might be implemented in the context of the present invention. The housing of the illustrated embodiment is a flexible, hollow, D-channel tube having an adhesive backing strip 49 affixed to the flat back side of the housing 22. The adhesive backing strip 49 can be implemented with any suitable adhesive, and can be used in conjunction with or in place of screws or other mounting hardware for securing the light emitting element array 20 to any desired surface. Since the D-channel housing is flexible, it does not detract from the flexible, conformal nature of a light emitting element array. The backside of the housing might also include a magnetic strip in addition to or in place of the adhesive backing strip, or any other form of fastening means by which the housing and light emitting element array assembly might be affixed to a surface.

Once the housing is provided, the element array 20 is slid into the housing and the housing is sealed by suitable end caps. Two guide surfaces, or lips, 51 and 53 are formed in the housing 22 in order to define two slots which are suitable for accommodating a flexible substrate 37. After the flexible substrate 37 is secured within the two slots of the housing, the end pieces and are secured into opposing ends 56 and 58 of the housing. An adhesive, preferably including sealant properties, is applied to a small diameter portion of each of the two end pieces. The small diameter portions of each of the two end pieces are subsequently inserted into the respective opposing ends 56 and 58 of the housing 22, such that the two end pieces are permanently secured to the housing. Once the end pieces are permanently secured, a watertight seal is created around the diode array and the array is thus protected from impact and the elements. Conductors for supplying power from an external power source extend through one or both of the end pieces, without disrupting the watertight seal, using conventional pass-through means.

It should be understood that even though the housing 22 is illustrated as a flexible, transparent, hollow D-channel tube, its profile properties are immaterial to practice of principles of the invention. In particular, where it is desirable to protect the diode array from the elements or from impact, any form of housing would be generally suitable. The housing might merely be a hemispherical cover having the appropriate flexibility and light transmission characteristics, or alternatively, the housing might have a square cross-section, rectangular cross-section, or any other shape that would tend to cover and protect the LED array. Indeed, in many applications, the array need not even be disposed within a housing.

It is contemplated that the high-density, low-profile, flexible light emitting diode array according to the exemplary embodiments of the present invention has application in a wide variety of environments. The following includes several of these contemplated applications, but is not intended to be either limiting or exhaustive. The array might have particular application in a traffic control environment, such as providing directional sign outline lighting, smart sensor activated lighting for traffic control, temporary barrier demarcation, active road signs, and the like. The array of the present invention also has various automotive and other applications, such as aircraft interior compartment lighting, automotive running lights, trailer indicator lights, decorative paneling, side panel turn indicators, and the like.

Figure 10A:
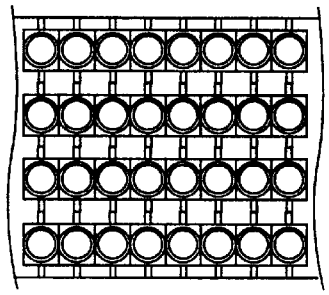
FIG. 10a is a simplified top planar view of an alternative array embodiment, where the light emitting diodes are disposed on a planar area sheet substrate.
Figure 10B:
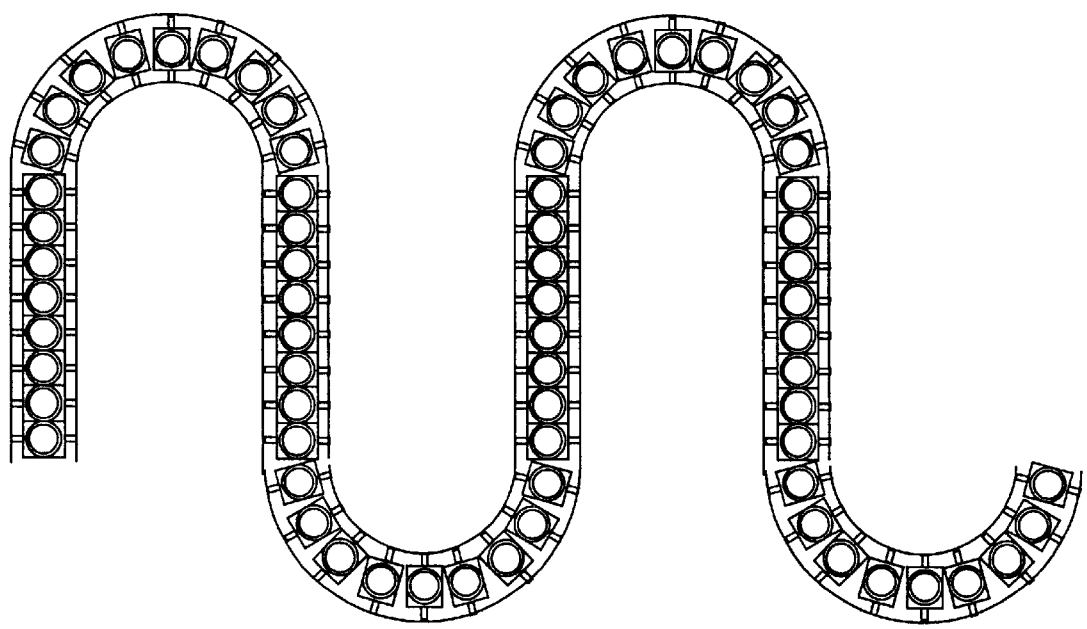
FIG. 10b is a simplified top planar view of a further alternative array embodiment, where the light emitting diodes are disposed along a cursive substrate.
Figure 1:
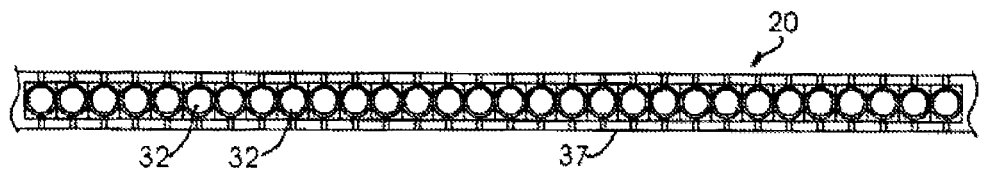
Figure 3:
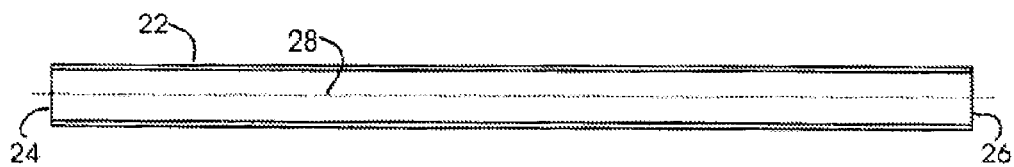
Figure 5:
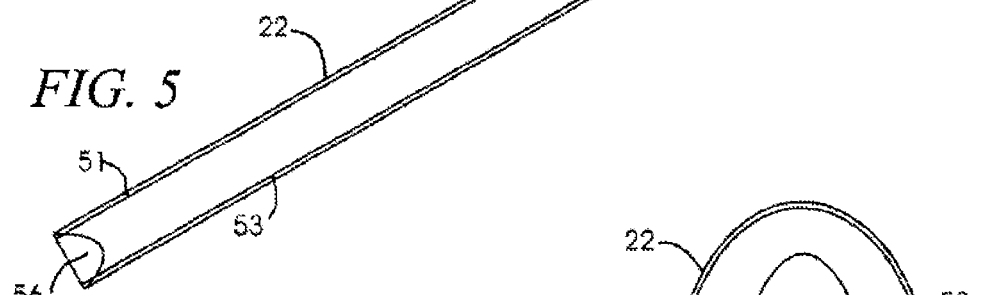
Figure 8:
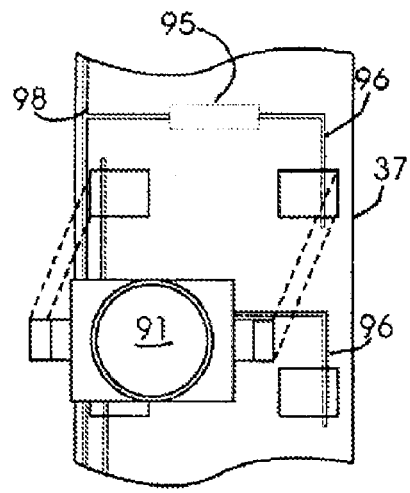
Figure 10A:
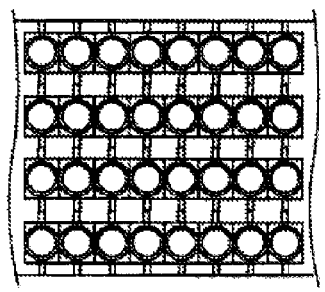

As depicted in FIGS. 10a and 10b, the elements need not be disposed in a linear fashion. Various alternative arrangements can be defined for a lighting system, according to the invention, depending on the configuration of the underlying flexible substrate. Since the flexible substrate/diode element combination is solely surface mount, substrates can be prepared to take on any shape or curvature, and the diode elements easily disposed thereon after substrate preparation. Substrates might be arranged in a sheet, with multiple rows of elements, as in FIG. 10a, or in cursives, as in FIG. 10b. Any manufacturable shape of substrate will accommodate a compact, low-profile, high intensity LED lighting system according to the invention.

It should be appreciated that the light emitting diode array of the present invention is completely impervious to moisture ingress, when disposed within an appropriate housing, and may therefore be used in certain underwater applications such as for aquarium or pool lighting. It will be evident that when enclosed in an appropriate housing, it has particular utility in exterior applications that might be otherwise susceptible to inclement weather.

It should further be appreciated that use of such high-density, low-profile, flexible light emitting diode arrays result in substantial cost savings over current lighting system implementations. Since LEDs, by their nature, are non-filament type light sources, there is no need to be concerned with breakage or frequent replacement. Further, since the LED array structure according to the invention provides a substantial light intensity output using only a nominal 12 volt, or thereabouts, power supply, there is no need to locate the arrays in proximity to an AC power source, as is required with conventional lighting systems. Low voltage and low current operation ensures that LED lighting systems will exhibit an average lifetime approximately an order of magnitude higher than that of conventional filament based lighting systems, while consuming at least several orders of magnitude lower current, for an equal light intensity output.

Thus, although various exemplary embodiments of the invention have been illustrated and described, various changes, modifications and substitutions, in addition to those set forth in the preceding specification, may be made by those having ordinary skill in the art without departing from the spirit and scope of the present invention, which is limited only by the scope of the appended claims.

What is claimed is:

1. A flexible, low profile lighting system, comprising:
   a flexible printed circuit board substrate, the substrate adapted to support and electrically interconnect surface mount electronic components, the printed circuit board substrate flexible through at least two axes of rotation;
   a plurality of surface mount light emitting diodes; and
   wherein the plurality of light emitting diodes are surface mounted on the flexible printed circuit board substrate, so as to define a conformably bendable lighting array configured for mounting upon surfaces with compound curvature substrate, the array outputting a uniform light intensity of at least 2000 millicandles per square centimeter.

2. The lighting system according to claim 1, wherein the flexible printed circuit board substrate comprises a flex circuit, the flex circuit pre-manufactured to define mounting locations for each of the plurality of surface mount light emitting diodes.

3. The lighting system according to claim 1, wherein the flexible printed circuit board substrate comprises a rigid flex circuit, the rigid flex circuit pre-manufactured to define mounting locations for each of the plurality of the surface mount light emitting diodes.

4. The lighting system according to claim 1, wherein each of the plurality of light emitting diodes is disposed on the flexible printed circuit board substrate in a linear array, each of the plurality of surface mount light emitting diodes emitting a light intensity of at least 100 millicandles, evaluated at each diode's optical axis.

5. The lighting system according to claim 1, wherein the plurality of surface mount light emitting diodes are disposed on the flexible printed circuit board substrate at a density of approximately 5 light emitting diodes per centimeter.

6. The lighting system according to claim 4, wherein each of the plurality of surface mount light emitting diodes has a length dimension and a width dimension, and wherein the length dimension is no greater than about 3 mm and the width dimension is no greater than about 2 mm.

7. A lighting system according to claim 4, wherein the length dimension is no greater than about 2 mm and the width dimension is no greater than about 1.5 mm.

8. The lighting system according to claim 4, wherein each of the plurality of surface mount light emitting diodes are surface mounted on the flexible printed circuit board substrate so as to contact at least one adjacent surface mount light emitting diode.

9. The lighting system according to claim 4, wherein the plurality of surface mount light emitting diodes are configured in an array, the array comprising regular sets of series-connected diodes, the series-connected sets coupled in parallel fashion to one another, the number of light emitting diodes comprising a series-connected set defining a forward voltage drop for the set, the forward voltage drop, in turn, defining a supply voltage value sufficient to activate the diodes of the series-connected set.

10. The lighting system according to claim 9, wherein each diode has a forward drop in the range of from about 1.7 to about 2.0 volts.

11. The lighting system according to claim 10, wherein each series connected set comprises 6 surface mount light emitting diodes, coupled in series fashion with a resistor element, each series-connected set operable by a 12.0 volt power supply.

12. The lighting system according to claim 9, wherein each diode has a forward drop of from about 4.0 to about 5.0 volts.

13. The lighting system according to claim 12, wherein each series connected set comprises 6 surface mount light emitting diodes, coupled in series fashion with a resistor element, each series-connected set operable by a 30 volt power supply.

14. A flexible, low profile lighting system, comprising:
   a flexible printed circuit board substrate, the substrate adapted to support and electrically interconnect surface mount electronic components;
   a plurality of surface mount light emitting diodes, wherein the plurality of light emitting diodes are surface mounted on the flexible printed circuit board substrate, the array outputting a uniform light intensity of at least 2000 millicandles per square centimeter; and
   a flexible housing enclosing the flexible printed circuit board substrate and the plurality of surface mount light emitting diodes.

15. The lighting system according to claim 14, wherein the flexible printed circuit board substrate is selected from the group consisting of a flex circuit and a rigid flex circuit, each flexible printed circuit board substrate pre-manufactured to define mounting locations for each of the plurality of surface mount light emitting diodes.

16. The lighting system according to claim 14, wherein the flexible housing is colored so as to impart a color component to light emitted from the plurality of surface mount light emitting diodes.

17. A lighting system according to claim 14, wherein the housing is formed of a clear material, each of the plurality of surface mount light emitting diodes emitting light at a particular wavelength so as to define a color.

18. The lighting system according to claim 14, wherein each of the plurality of surface mount light emitting diodes emits a light intensity of at least 100 millicandles, evaluated at each diode's optical axis.

19. The lighting system according to claim 18, wherein each of the plurality of surface mount light emitting diodes emits a light intensity of at least 1000 millicandles, evaluated at each diode's optical axis.

20. A flexible, low profile lighting system, comprising:
a flexible printed circuit board substrate, having a first end, a second end, and an axis extending between the first and second end, the flexible printed circuit board substrate further including a width dimension measured in a direction transverse to the axis that is less than 5 mm; and
a plurality of surface mount light emitting diodes, disposed on the flexible printed circuit board substrate such that the plurality of diodes emits a uniform light intensity of from about 2000 to about 20,000 millicandles per square centimeter.

21. The lighting system according to claim 20, wherein the flexible printed circuit board substrate is chosen from the group consisting of a flex circuit and a rigid flex circuit, the flexible printed circuit board substrate pre-manufactured to define mounting locations for each of the plurality of the surface mount light emitting diodes.

22. The lighting system according to claim 21, wherein each of the plurality of surface mount light emitting diodes emits light at a viewing angle of at least 30 degrees.

23. The lighting system according to claim 22, wherein each of the plurality of surface mount light emitting diodes emits light at a viewing angle of at least 120 degrees.

* * * * *

US006371637C1

(12) EX PARTE REEXAMINATION CERTIFICATE (8308th)
United States Patent
Atchinson et al.

(10) Number: US 6,371,637 C1
(45) Certificate Issued: Jun. 7, 2011

(54) COMPACT, FLEXIBLE, LED ARRAY

(76) Inventors: Geoffrey P. Atchinson, Irvine, CA (US); Mitchell A. Valentine, Irvine, CA (US)

Reexamination Request:
No. 90/009,343, Nov. 26, 2008
No. 90/009,611, Nov. 2, 2009

Reexamination Certificate for:
Patent No.: 6,371,637
Issued: Apr. 16, 2002
Appl. No.: 09/477,637
Filed: Jan. 3, 2000

Related U.S. Application Data

(63) Continuation-in-part of application No. 09/258,057, filed on Feb. 26, 1999, now abandoned.

(51) Int. Cl.
*F21S 4/00* (2006.01)
*F21S 9/00* (2006.01)
*F21S 9/02* (2006.01)
*F21V 19/00* (2006.01)
*H05K 1/18* (2006.01)

(52) U.S. Cl. ............... 362/555; 362/249.04; 362/249.06; 362/249.16; 362/800

(58) Field of Classification Search .......................... None
See application file for complete search history.

(56) References Cited

U.S. PATENT DOCUMENTS

| | | | |
|---|---|---|---|
| 4,298,869 A | | 11/1981 | Okuno |
| 4,521,835 A | * | 6/1985 | Meggs et al. ................. 362/470 |
| 4,682,147 A | | 7/1987 | Bowman |
| 5,155,669 A | * | 10/1992 | Yamuro .................. 362/249.06 |
| 5,815,200 A | | 9/1998 | Ju et al. |
| 5,920,643 A | * | 7/1999 | White et al. ................. 382/141 |
| 6,126,303 A | * | 10/2000 | Gross .......................... 362/544 |
| 6,158,882 A | | 12/2000 | Bischoff, Jr. |
| 6,371,637 B1 | | 4/2002 | Atchinson et al. |

OTHER PUBLICATIONS

"The LED Light.com" at http://www.theledlight.com/technical1.html.*
Light Emitting Diodes (LEDs) at http://www.kpsec.freeuk.com/components/led.htm.*
"Electronics Tutorial about Light Emitting Diodes" at http://www.electronics-tutorials.ws/diode/diode_8.html.*
MIL-STD-2118, "Flexible and Rigid-Flex Printed-Wiring for Electronic Equipment, Design Requirements for", Department of Defense, May 4, 1984.
"High Performance LEDs", Marktech Optoelectronics LED Products Data Book, Marktech Optoelectronics, Latham, NY.
Author Unknown. "Surface Mount LED Lamps." LED Products Data Book, Marktech Optoelectronics, Latham, NY, Jul. 1997.

* cited by examiner

*Primary Examiner*—Pia Tibbits

(57) ABSTRACT

A flexible, high density, low profile lighting system includes a flexible printed circuit board substrate which is adapted to support and electrically interconnect surface mount electronic components. Plurality of surface mount light emitting diodes is mounted on the substrate so as to define a conformably bendable lighting array configured for mounting upon surfaces with compound curvature: Each of the surface mount light emitting diodes has a footprint of 5 $mm^2$, or less, and, when mounted adjacent and in contact with one another defines a light intensity output of from about 2 to about 20 candles per $cm^2$.

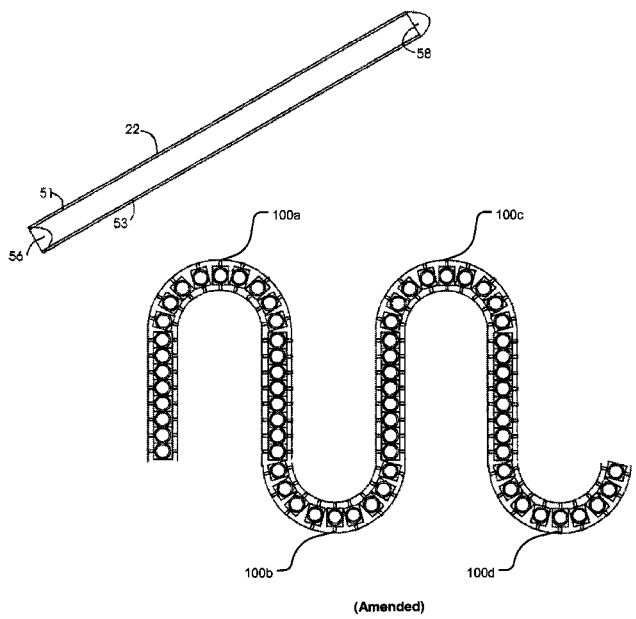

(Amended)

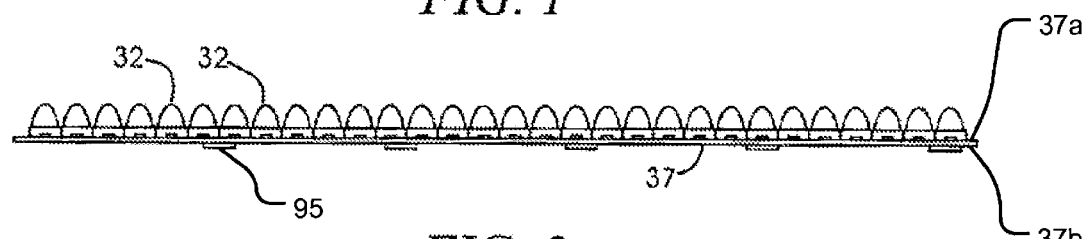
FIG. 2
(Amended)
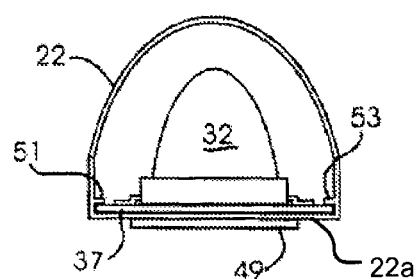
FIG. 4
(Amended)

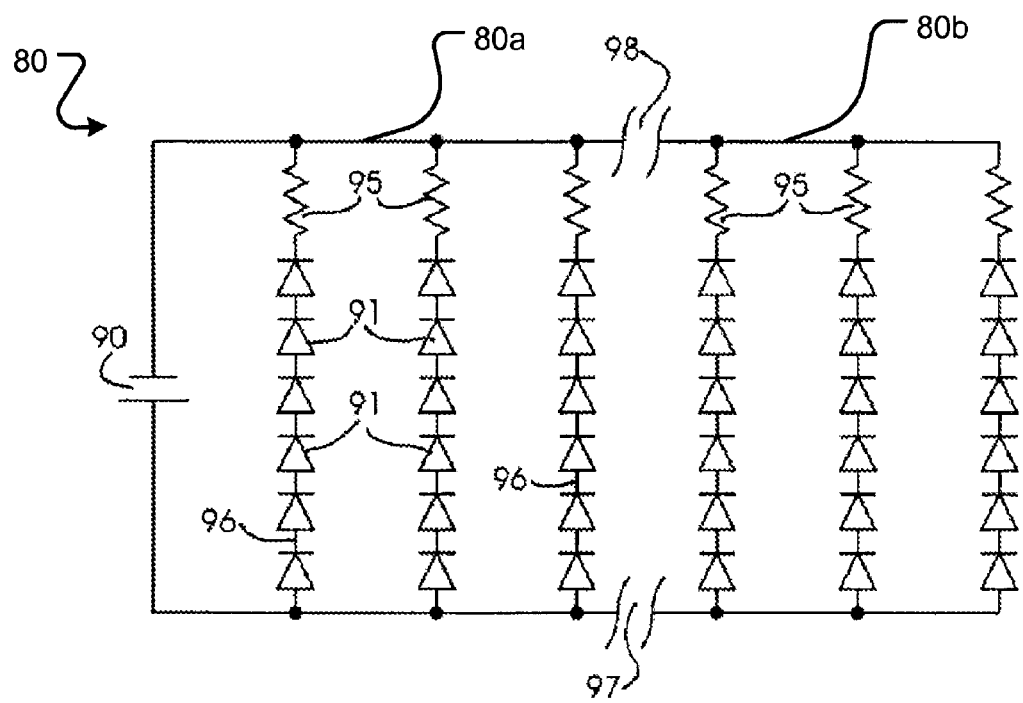
*FIG. 9*
(Amended)

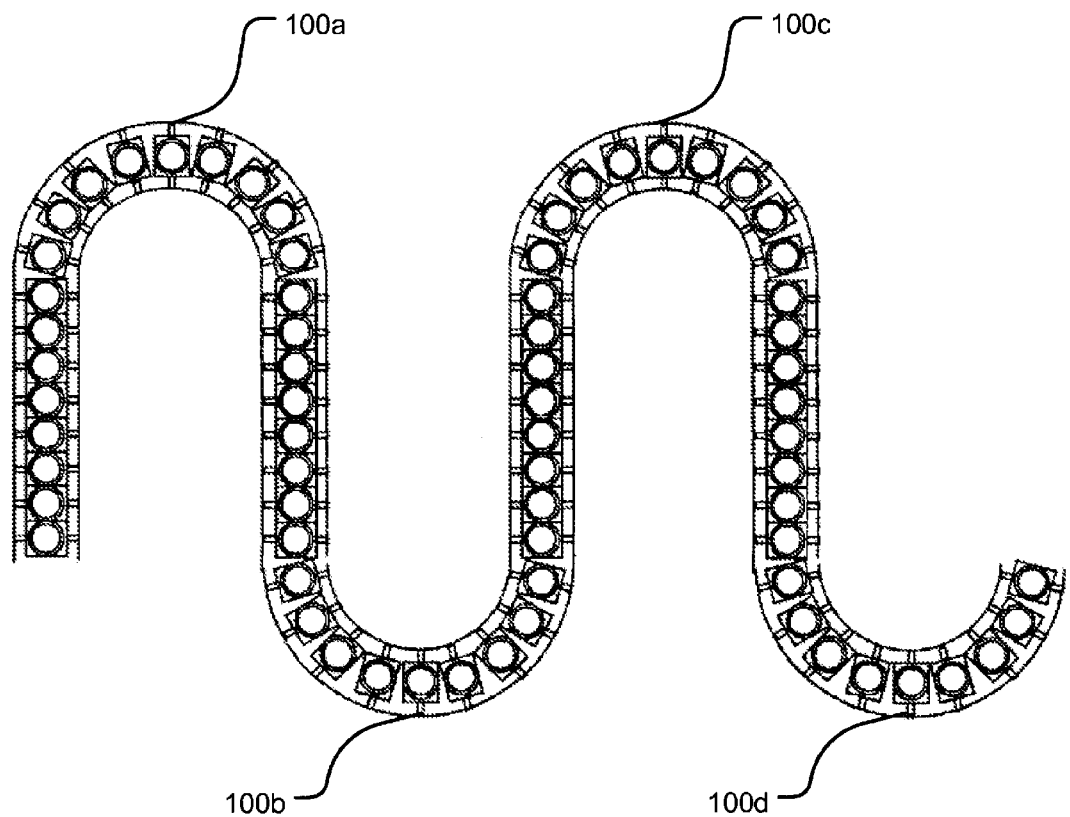
*FIG. 10b*
(Amended)

US $6,371,637 C1

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE
SPECIFICATION AFFECTED BY AMENDMENT
ARE PRINTED HEREIN.

Column 4, lines 9-29:

The high-density, low-profile, flexible light emitting diode array is very compact and elegant which enables it to be used for a number of sophisticated interior applications, such as volume or accent highlighting, architectural and landscaping delineation, and the like. Additionally, the high-density, low-profile, flexible light emitting diode array is able to deliver a very high light output (light intensity) per unit volume, which enables the light emitting diode array to be used for various industrial, safety and other exterior utility applications, such as vehicle lighting systems, marker lights, building safety lamps, and the like. Flexibility is a further advantageous feature of the light emitting diode array which is configured such that it is able to be flexed or bent into extremely compound or complex shapes including those with a very small radius of curvature. *(FIG. 10B. 100a-d).* When a flexible strip of the light emitting array is affixed to an interior rear window or ceiling of an automobile, for example, as an auxiliary brake light, the extremely thin and narrow profile of the array does not substantially block a driver's vision nor does it substantially intrude into the limited interior space of the passenger compartment of the vehicle.

Column 8, lines 9-23:

Turning now to FIG. 9, there is depicted in simplified, semi-schematic form, an exemplary circuit diagram showing the electrical connectivity of the surface mount LED elements, resistive elements and power source, as they might be implemented on a typical flexible substrate (as shown in FIG. 8), in accordance with the present invention. As contemplated by the invention, a flexible printed circuit board (37 of FIG. 8) is double-sided, with the surface mount light emitting elements 91 connected to a front side (or facing side) *37a* with resistive elements 95 and electrical traces 96 disposed on the opposite side (backside) *37b* of the flexible printed circuit board. This particular arrangement allows for an extremely compact distribution of surface mount lighting elements along the facing surface of a flexible printed circuit board.

Column 9, lines 9-20:

It will be further evident from the exemplary embodiment of FIG. 9, that coupling a plurality of series-connected diode strings in parallel fashion with one another 80, allows the diode array to be fabricated in long rolls, and to be cut to length by merely separating parallel sections*, 80a and 80b,* from one another by cutting the supply lead between parallel-disposed series stacks (indicated at 97) and by cutting the return lead between resistors (indicated at 98). Thus, it should be understood that using a "flex circuit" substrate is particularly advantageous when the light emitting diode array is manufactured in a roll and intended to be cut to length upon application.

Column 10, lines 6-21:

FIGS. 3, 4 and 5 illustrate a top planar, end and perspective view, respectively of a typical housing 22 such as might be implemented in the context of the present invention. The housing of the ilustrated embodiment is a flexible, hollow, D-channel tube having an adhesive backing strip 49 affixed to the flat back side of the housing 22*a*. The adhesive backing strip 49 can be implemented with any suitable adhesive, and can be used in conjunction with or in place of screws or other mounting hardware for securing the light emitting element array 20 to any desired surface. Since the D-channel housing is flexible, it does not detract from the flexible, conformal nature of a light emitting element array. The backside of the housing might also include a magnetic strip in addition to or in place of the adhesive backing strip, or any other form of fastening means by which the housing and light emitting element array assembly might be affixed to a surface.

THE DRAWING FIGURES HAVE BEEN
CHANGED AS FOLLOWS:

Radius of curvature—100—FIG. 10B, Radii of curvature—100a-d—FIG. 10b;

Back side of housing—22a—FIG 4;

Front side—37a—FIG. 2, Backside—37b—FIG. 2, FIG. 2—95—resistive element;

Array—80—FIG. 9; 80a, 80b—parallel sections of the array—FIG. 9.

AS A RESULT OF REEXAMINATION, IT HAS BEEN DETERMINED THAT:

Claims 1-8 are cancelled.

Claims 9, 14 and 20 are determined to be patentable as amended.

Claims 10-13, 15-19, and 21-23, dependent on an amended claim, are determined to be patentable.

New claims 26-35, 37-40, 44-47, 49-52, 54, 60-63, and 65-69 are added and determined to be patentable.

9. [The lighting system according to claim 4,] *A flexible, low profile lighting system, comprising:*

*a flexible printed circuit board substrate, the substrate adapted to support and electrically interconnect surface mount electronic components, the printed circuit board substrate flexible through at least two axes of rotation, wherein flexible through at least two axes of rotation comprises the flexible printed circuit board substrate being flexible to a first radius of curvature at a first point along its length and to a second radius of curvature at a second point along its length;*

*a plurality of surface mount light emitting diodes; and*

*a flexible housing;*

*wherein the plurality of light emitting diodes are surface mounted on the flexible printed circuit board substrate, so as to define a conformably bendable lighting array configured for mounting upon surfaces with compound curvature, the array outputting a uniform light intensity of at least 2000 millicandles per square centimeter;* wherein each of the plurality of surface mount light emitting diodes emitting a light intensity of at least 100 millicandles, evaluated at each diode's optical axis;

wherein the [plurality of surface mount light emitting diodes are configured in an array, the] array [comprising] *comprises* regular sets of series-connected diodes, the series-connected sets coupled in parallel fashion to one another, the number of light emitting diodes comprising a series-connected set defining a forward voltage drop for the set, the forward voltage drop, in turn, defining a supply voltage value sufficient to activate the diodes of the series-connected set*;*

*wherein the flexible housing comprises an elongated D-channel tube having a substantially planar first surface and a curved second surface, wherein an adhesive backing strip affixed to the substantially planar first surface;*

*wherein the flexible housing further comprises a first guide surface and a second guide surface for securing the flexible printed circuit board substrate within the flexible housing;*

*wherein the first and second guide surfaces are each substantially parallel to the substantially planar first surface; and*

*wherein the flexible printed circuit board substrate has a thickness and the first and second guide surfaces are each separated from the substantially planar first surface by a distance substantially equal to the thickness of the flexible printed circuit board substrate.*

14. A flexible, low profile lighting system, comprising:

a flexible printed circuit board substrate, the substrate adapted to support and electrically interconnect surface mount electronic components;

a plurality of surface mount light emitting diodes, wherein the plurality of light emitting diodes are surface mounted on the flexible printed circuit board substrate, the array outputting a uniform light intensity of at least 2000 millicandles per square centimeter; and a flexible housing enclosing the flexible printed circuit board substrate and the plurality of surface mount light emitting diodes*;*

*wherein the housing further comprises a first end cap and a second end cap;*

*wherein the flexible housing comprises an elongated D-channel tube having a substantially planar first surface and a curved second surface, wherein an adhesive backing strip affixed to the substantially planar first surface;*

*wherein the flexible housing further comprises a first guide surface and a second guide surface for securing the flexible printed circuit board substrate within the flexible housing;*

*wherein the first and second guide surfaces are each substantially parallel to the substantially planar first surface; and*

*wherein the flexible printed circuit board substrate has a thickness and the first and second guide surfaces are each separated from the substantially planar first surface by a distance substantially equal to the thickness of the flexible printed circuit board substrate.*

20. A flexible, low profile lighting system, comprising:

a flexible printed circuit board substrate, having a first end, a second end, and an axis extending between the first and second end, the flexible printed circuit board substrate further including a width dimension measured in a direction transverse to the axis that is less than 5 mm; [and]

a plurality of surface mount light emitting diodes, disposed on the flexible printed circuit board substrate such that the plurality of diodes emits a uniform light intensity of from about [2000] *4,000* to about 20,000 millicandles per square centimeter*; and*

*a flexible housing;*

*wherein the flexible housing comprises an elongated D-channel tube having a substantially planar first surface and a curved second surface, wherein an adhesive backing strip affixed to the substantially planar first surface;*

*wherein the flexible housing further comprises a first guide surface and a second guide surface for securing the flexible printed circuit board substrate within the flexible housing;*

*wherein the first and second guide surfaces are each substantially parallel to the substantially planar first surface; and*

*wherein the flexible printed circuit board substrate has a thickness and the first and second guide surfaces are each separated from the substantially planar first surface by a distance substantially equal to the thickness of the flexible printed circuit board substrate.*

*24. The lighting system according to claim 14, further comprising:*

*a resistor mounted to a back side of the flexible printed circuit board substrate; and*

*wherein the plurality of surface mount light emitting diodes comprises six light emitting diodes mounted to a front side of the flexible printed circuit board substrate.*

*25. The lighting system according to claim 14, wherein the plurality of surface mount light emitting diodes are configured in an array, the array comprising regular sets of series-connected diodes, the series-connected sets coupled in parallel fashion to one another.*

*26. The lighting system according to claim 25, further comprising a plurality of resistors, wherein each resistor is connected in series to a respective series-connected set of surface mount light emitting diodes.*

*27. The lighting system according to claim 26, wherein the number of light emitting diodes comprising a series-connected set along with the resistor connected to the series connected set defines a forward voltage drop for the set, the forward voltage drop, in turn, defines a supply voltage value sufficient to activate the diodes of the series-connected set.*

*28. The lighting system according to claim 27, where the plurality of surface mount light emitting diodes is mounted on a front side of the printed circuit board substrate and the plurality of resistors is mounted on a back side of the printed circuit board substrate.*

*29. The lighting system according to claim 26, wherein a first series-connected set of surface mount light emitting diodes can be cut off of the array of surface mount light emitting diodes without affecting the operation of the remaining series-connected sets of surface mount light emitting diodes.*

*30. The lighting system according to claim 29, wherein the first series-connected set of surface mount light emitting diodes comprises at least three light emitting diodes.*

*31. The lighting system according to claim 25, wherein a first series-connected set of surface mount light emitting diodes can be cut off of the array of surface mount light emitting diodes without affecting the operation of the remaining series-connected sets of surface mount light emitting diodes, and*

*wherein the flexible housing can be cut to accommodate the length of the shortened array of surface mount light* emitting diodes and the second end cap can be inserted into the cut end of the shortened flexible housing.

32. The lighting system according to claim 14, wherein said plurality of surface mount light emitting diodes comprises light emitting diodes with two leads extending from each light emitting diode for mounting the respective light emitting diode to the surface of the flexible printed circuit board substrate.

33. The flexible, low profile lighting system of claim 14, wherein the array outputs a uniform light intensity without the use of a light distorting element.

34. A flexible, low profile light system of claim 14, wherein the flexible printed circuit board substrate is flexible to a first radius of curvature at a first point along its length and to a second radius of curvature at a second point along its length.

35. The flexible, low profile lighting system of claim 20, wherein the flexible printed circuit board substrate is flexible to a first radius of curvature at a first point along its length and to a second radius of curvature at a second point along its length.

36. A flexible, low profile lighting system, comprising:
a flexible, printed circuit board substrate having a front side and a back side, the substrate adapted to support and electrically interconnect surface mount electronic components;
a plurality of surface mount light emitting diodes, wherein the plurality of light emitting diodes are surface mounted on the front side of the flexible printed circuit board substrate, the array outputting a uniform light intensity of at least 2000 millicandles per square centimeter;
a plurality of resistors mounted on the back side of the flexible printed circuit board substrate; and
a flexible housing enclosing the flexible printed circuit board substrate and the plurality of surface mount light emitting diodes;
wherein the flexible housing comprises an elongated D-channel tube having a substantially planar first surface and a curved second surface, wherein an adhesive backing strip affixed to the substantially planar first surface;
wherein the flexible housing further comprises a first guide surface and a second guide surface for securing the flexible printed circuit board substrate within the flexible housing;
wherein the first and second guide surfaces are each substantially parallel to the substantially planar first surface; and
wherein the flexible printed circuit board substrate has a thickness and the first and second guide surfaces are each separated from the substantially planar first surface by a distance substantially equal to the thickness of the flexible printed circuit board substrate.

37. The lighting system according to claim 36, wherein the plurality of surface mount light emitting diodes are configured in an array, the array comprising regular sets of series-connected diodes, the series-connected sets coupled in parallel fashion to one another.

38. The lighting system according to claim 37, wherein each of said plurality of resistors is connected in series to a respective series-connected set of surface mount light emitting diodes.

39. The lighting system according to claim 37, wherein a first series-connected set of surface mount light emitting diodes can be cut off of the array of surface mount light emitting diodes without affecting the operation of the remaining series-connected sets of surface mount light emitting diodes.

40. The lighting system according to claim 36, wherein said plurality of surface mount light emitting diodes comprises light emitting diodes with two leads extending from each light emitting diode for mounting the respective light emitting diode to the surface of the flexible printed circuit board substrate.

41. The flexible, low profile lighting system of claim 36, wherein the flexible printed circuit board substrate is flexible to a first radius of curvature at a first point along its length and to a second radius of curvature at a second point along its length.

42. A flexible, low profile lighting system, comprising:
a flexible printed circuit board substrate, the substrate adapted to support and electrically interconnect surface mount electronic components;
a plurality of surface mount light emitting diodes, wherein the plurality of light emitting diodes are surface mounted on the flexible printed circuit board substrate defining an array, the array outputting a uniform light intensity of at least 2000 millicandles per square centimeter; wherein the flexible printed circuit board substrate is flexible to a first radius of curvature at a first point along its length and to a second radius of curvature at a second point along its length; and
a flexible housing enclosing the flexible printed circuit board substrate and the plurality of surface mount light emitting diodes;
wherein the flexible housing comprises an elongated D-channel tube having a substantially planar first surface and a curved second surface, wherein an adhesive backing strip affixed to the substantially planar first surface;
wherein the flexible housing further comprises a first guide surface and a second guide surface for securing the flexible printed circuit board substrate within the flexible housing;
wherein the first and second guide surfaces are each substantially parallel to the substantially planar first surface; and
wherein the flexible printed circuit board substrate has a thickness and the first and second guide surfaces are each separated from the substantially planar first surface by a distance substantially equal to the thickness of the flexible printed circuit board substrate.

43. The flexible, low profile lighting system of claim 42, further comprising a plurality of resistors, wherein the flexible printed circuit board substrate comprises a front side and back side, and wherein the plurality of light emitting diodes are surface mounted on the front side of the flexible printed circuit board substrate, and wherein the plurality of resistors are surface mounted on the back side of the flexible printed circuit board.

44. The flexible, low profile lighting system of claim 43, wherein the array comprises a plurality of series-connected sets comprising series-connected diodes and a resistor, the plurality of series-connected sets coupled in parallel fashion to one another.

45. The flexible, low profile lighting system of claim 44, wherein a series-connected set can be cut off of the array without affecting the operation of the array and remaining series-connected sets.

46. The flexible, low profile lighting system of claim 42, wherein the first radius of curvature and the second radius of curvature define an "S" shape.

47. The flexible, low profile lighting system of claim 42, wherein the linear array outputs a uniform light intensity without the use of a light diffusing element.

48. A flexible, low profile lighting system comprising:
- a flexible printed circuit board substrate, the substrate adapted to support and electrically interconnect surface mount electronic components, the substrate having a front side and a back side;
- a plurality of surface mount light emitting diodes, wherein the plurality of light emitting diodes are surface mounted on the front side of the flexible printed circuit board substrate defining an array, the array outputting a uniform light intensity of at least 2000 millicandles per square centimeter;
- a plurality of resistors, the resistors surface mounted on the back side of the flexible printed circuit board; and
- a flexible housing enclosing the flexible printed circuit board substrate and the plurality of surface mount light emitting diodes, wherein the housing further comprises a first end cap and a second end cap,
- wherein the array comrpises a plurality of series-connected sets comprising series-connected diodes and a resistor, the plurality of series-connected sets each coupled in parallel fashion to one another;
- wherein one or more series-connected sets can be removed from an end of the array effectively shortening the array without affecting the operation of the array and remaining series-connected sets;
- wherein the flexible housing comprises an elongated D-channel tube having a substantially planar first surface and a curved second surface, wherein an adhesive backing strip affixed to the substantially planar first surface;
- wherein the flexible housing further comprises a first guide surface and a second guide surface for securing the flexible printed circuit board substrate within the flexible housing;
- wherein the first and second guide surfaces are each substantially parallel to the substantially planar first surface; and
- wherein the flexible printed circuit board substrate has a thickness and the first and second guide surfaces are each separated from the substantially planar first surface by a distance substantially equal to the thickness of the flexible printed circuit board substrate.

49. The flexible, low profile lighting kit of claim 48, wherein the array and the housing are flexible to a first radius of curvature at a first point along their length and to a second radius of curvature at a second point along their length.

50. The flexible, low profile lighting kit of claim 49, wherein the first radius of curvature and the second radius of curvature define an "S" shape.

51. A flexible, low profile lighting system, comprising:
- a flexible printed circuit board substrate comprising a front side and back side, the substrate adapted to support and electrically interconnect surface mount electronic components, the flexible printed circuit board substrate flexible to a first radius of curvature at a first point along its length and to a second radius of curvature at a second point along its length;
- a plurality of surface mount light emitting diodes, wherein the plurality of light emitting diodes are surface mounted on the front side of the flexible printed circuit board substrate, the plurality of surface mount light emitting diodes outputting a uniform field of light;
- a plurality of resistors, wherein the plurality of resistors are surface mounted on the back side of the flexible printed circuit board, wherein the flexible printed circuit board substrate, the plurality of surface mount light emitting diodes, and the plurality of resistors define an array; and
- a flexible housing enclosing the array, wherein the housing further comprises a first end cap and a second end cap,
- wherein the array comprises a plurality of series-connected sets comprising series-connected diodes and a resistor, the plurality of series-connected sets coupled in parallel fashion to one another;
- wherein a series-connected set can be cut off of the array without affecting the operation of the array and remaining series-connected sets;
- wherein the flexible housing comprises an elongated D-channel tube having a substantially planar first surface and a curved second surface, wherein an adhesive backing strip affixed to the substantially planar first surface;
- wherein the flexible housing further comprises a first guide surface and a second guide surface for securing the flexible printed circuit board substrate within the flexible housing;
- wherein the first and second guide surfaces are each substantially parallel to the substantially planar first surface; and
- wherein the flexible printed circuit board substrate has a thickness and the first and second guide surfaces are each separated from the substantially planar first surface by a distance substantially equal to the thickness of the flexible printed circuit board substrate.

52. A flexible, low profile lighting system, comprising:
- a flexible printed circuit board substrate, the substrate adapted to support and electrically intereconnect surface mount electronic components;
- a plurality of surface mount light emitting diodes, wherein the plurality of light emitting diodes are surface mounted on the flexible printed circuit board substrate, the array outputting a uniform light intensity of at least 2000 millicandles per square centimeter; and
- a flexible housing enclosing the flexible printed circuit board substrate and the plurality of surface mount light emitting diodes, the flexible housing being an elongated D-channel tube having a substantially planar first surface and a curved second surface;
- the flexible housing also includes a first guide surface and a second guide surface for securing the flexible printed circuit board substrate within the flexible housing;
- wherein the housing further comprises a removable first end cap and a removable second end cap.

53. The flexible, low profile lighting system of claim 52, wherein the first and second guide surfaces are each substantially parallel to the substantially planar first surface.

54. The flexible, low profile lighting system of claim 52, wherein the flexible printed circuit board substrate has a thickness and the first and second guide surfaces are each separated from the substantially planar first surface by a distance substantially equal to the thickness of the flexible printed circuit board substrate.

55. The flexible, low profile lighting system of claim 52, further comprising an adhesive backing strip affixed to the substantially planar first surface.

* * * * *